United States Patent
Talluri et al.

(10) Patent No.: US 10,438,757 B2
(45) Date of Patent: Oct. 8, 2019

(54) METHOD FOR ESTIMATING AN ELECTRICAL OPERATING TIME OF A CIRCUIT BREAKER

(71) Applicant: ABB Schweiz AG, Baden (CH)

(72) Inventors: Anil Talluri, Bangalore (IN); Anoop Parapurath, Bangalore (IN); Rahul Radhakrishnan, Trivandrum (IN)

(73) Assignee: ABB Schweiz AG, Baden (CH)

( * ) Notice: Subject to any disclaimer, the term of this patent is extended or adjusted under 35 U.S.C. 154(b) by 306 days.

(21) Appl. No.: 15/531,310

(22) PCT Filed: Nov. 30, 2015

(86) PCT No.: PCT/IB2015/059213
§ 371 (c)(1),
(2) Date: May 26, 2017

(87) PCT Pub. No.: WO2016/084057
PCT Pub. Date: Jun. 2, 2016

(65) Prior Publication Data
US 2017/0358405 A1   Dec. 14, 2017

(30) Foreign Application Priority Data
Nov. 30, 2014 (IN) .......................... 5993/CHE/2014

(51) Int. Cl.
*H01H 9/56* (2006.01)
*G04F 10/10* (2006.01)
(Continued)

(52) U.S. Cl.
CPC ............... *H01H 9/56* (2013.01); *G04F 10/10* (2013.01); *H01H 9/563* (2013.01);
(Continued)

(58) Field of Classification Search
CPC ................. H01H 9/563; H01H 33/593; H01H 2009/566; H03K 17/16; H03K 17/28; G04F 10/10
(Continued)

(56) References Cited

U.S. PATENT DOCUMENTS

| 5,119,260 A | 6/1992 | Huhse et al. |
| 2007/0285850 A1 | 12/2007 | Koyama et al. |

(Continued)

FOREIGN PATENT DOCUMENTS

WO   2012152829 A1   11/2012

OTHER PUBLICATIONS

"Controlled Switching Buyer's and Application Guide", Aug. 19, 2013, 54 pages.
(Continued)

*Primary Examiner* — Zeev V Kitov
(74) *Attorney, Agent, or Firm* — Barnes & Thornburg LLP

(57) ABSTRACT

The present invention provides a method of determining an electrical operating time of a circuit breaker (140) in a multiphase electrical system having a subsystem (160) at an electric potential resulting from electrical characteristics of electrical components within the subsystem. The method comprises monitoring (145) the voltage of the subsystem in the first phase, determining a first rate of change from the monitored voltage in the first phase, detecting at least one instance of switching based on the first rate of change, determining an electrical operating time of the circuit breaker based on the detected at least one instance of switching and an instance at which a command for switching was provided to the circuit breaker.

9 Claims, 5 Drawing Sheets

(51) Int. Cl.
*H01H 33/59* (2006.01)
*H03K 17/16* (2006.01)
*H03K 17/28* (2006.01)
*H03K 17/13* (2006.01)

(52) U.S. Cl.
CPC ........... *H01H 33/593* (2013.01); *H03K 17/16* (2013.01); *H03K 17/28* (2013.01); *H01H 2009/566* (2013.01); *H03K 17/13* (2013.01)

(58) Field of Classification Search
USPC ........................................................ 361/211
See application file for complete search history.

(56) References Cited

U.S. PATENT DOCUMENTS

| 2009/0027824 | A1 | 1/2009 | Allen et al. | |
| 2010/0141050 | A1* | 6/2010 | Saito | H01H 9/563 307/141 |
| 2010/0141463 | A1* | 6/2010 | Schweitzer | G08B 3/10 340/658 |
| 2010/0254060 | A1* | 10/2010 | Saito | H01H 9/56 361/115 |

OTHER PUBLICATIONS

International Search Report, International Application No. PCT/IB2015/059213, search completed Jan. 28, 2016, 5 pages.
International Written Opinion issued in connection with International Application No. PCT/IB2015/059213, dated Jan. 28, 2016, 6 pages.
International Preliminary Report on Patentability, International Application No. PCT/IB2015/059213, search completed Jun. 6, 2017, 7 pages.

* cited by examiner

METHOD FOR ESTIMATING AN ELECTRICAL OPERATING TIME OF A CIRCUIT BREAKER

CROSS-REFERENCE TO RELATED APPLICATIONS

This application is a U.S. national stage of International Application Serial No. PCT/IB2015/059213, filed Nov. 30, 2015, which claims priority to Indian Patent Application No. 5993/CHE/2014, filed Nov. 30, 2014. The entire disclosures of both of the foregoing applications are hereby incorporated by reference.

FIELD OF THE INVENTION

The present invention relates to point on wave controllers. More particularly, the present invention relates to point on wave controllers employed for loads at electric potential due to electrical characteristics of the load.

BACKGROUND

In power systems, circuit breakers are used for connecting and disconnecting a load. During this process, the active elements of the circuit breaker either interrupt or incept high current, causing stresses in the circuit breaker as well as the connected power system components. The flow of the high current can be limited by closing and opening the circuit breaker at a specific instance on the source voltage waveform. A plurality of techniques are known for controlling the opening or closing of the circuit breaker in order to prevent generation of transient phenomenon. Such techniques rely on the usage of devices that perform synchronized switching control. One such device is the point on wave controller.

Point on wave controller is used for controlling switching instance of the circuit breaker. On receiving a command from a control unit, the point on wave controller advances the command to achieve closing or opening at an instance to minimize the current. The point on wave controller detects the opening or closing actuation time (also referred to as operating time) of the circuit breaker and calculates a time for switching in respect of the opening or closing command of the circuit breaker to ensure switching on a particular point on the voltage waveform. The point on wave controller determines the opening or closing actuation time as the time period between the instance at which the command was given to the circuit breaker and the instance at which electrical switching (i.e. interruption or inception of the electrical connection) happened.

Conventionally, for detecting the switching instance, the point on wave controller relies on current measurements from a current sensor connected to the load. However, for certain types of loads, such as inductive loads (transformers) or capacitive loads (transmission lines), the charging current is often of such small magnitudes that they cannot be accurately detected within the tolerance range of the current sensor and sensing accuracy required. Therefore, for such loads, current feedback based detection of switching instance cannot be applied.

There have been several attempts to solve the problem mentioned above. In one approach, instead of current, voltage has been used to determine the instance of switching. A voltage transformer is connected to the load. Based on the presence or absence of voltage, the point on wave controller determines the instance of switching. However, this voltage feedback approach is not applicable in scenarios where the load is already at a potential induced by electrostatic or electrodynamic means through a neighboring electrical element.

Therefore, in light of the abovementioned discussion, there is a need for a method and system that satisfies the above mentioned problems.

BRIEF DESCRIPTION OF THE INVENTION

The above-mentioned shortcomings, disadvantages and problems are addressed herein which will be understood by reading and understanding the following specification.

In one aspect, the present invention provides a method of determining an electrical operating time of a circuit breaker for performing point on wave switching in a multiphase electrical system. The multiphase electrical system has a power source connectable to a subsystem, through the circuit breaker. The circuit breaker is operated by a controller. The subsystem is capable of being at an electric potential resulting from electrical characteristics of electrical components within the subsystem, when disconnected from the power source. The controller is connected to a potential transformer for measuring voltage of the subsystem in a first phase.

The method comprises monitoring the voltage of the subsystem in the first phase, determining a first rate of change from the monitored voltage in the first phase, detecting at least one instance of switching based on the first rate of change associated with voltage of the subsystem in the first phase of the multiphase electrical system, and determining an electrical operating time of the circuit breaker based on the detected at least one instance of switching and an instance at which a command for switching was provided to the circuit breaker.

In an embodiment, the method further comprises estimating a time for switching for operating the circuit breaker based on the determined electrical operating time of the circuit breaker and system characteristics data associated with the subsystem. In an embodiment, the detecting the at least one instance of switching further comprises monitoring a voltage associated with the power source in at least one phase, calculating at least one second rate of change from voltage associated with the power source in the at least one phase within a half cycle, and determining a ratio based on the first rate of change and the at least one second rate of change for detecting the at least one instance of switching.

In an embodiment, the method further comprises associating the detected at least one instance of switching with a corresponding phase of the multiphase electrical system. The at least one instance of switching, is a last instance of switching in the corresponding phase within a predetermined time window, wherein the predetermined window is based on a mechanical operating time associated with circuit breaker.

In an embodiment, the method further comprises associating the detected at least one instance of switching with a corresponding phase of the multiphase electrical system. The at least one instance of switching, is a first instance of switching in the corresponding phase within a predetermined time window, wherein the predetermined window is based on a mechanical operating time associated with circuit breaker.

In an embodiment, the method further comprises determining a sequence of switching associated with the one or more phases of the multiphase electrical system based on association between one or more instances of switching and the corresponding one or more phases.

In another aspect, the present invention discloses a controller configured to operate a circuit breaker in a multiphase electrical system having a power source connectable to a subsystem. The controller comprises one or more processors configured to monitor the voltage of the subsystem in the first phase, and determine a first rate of change from the monitored voltage in the first phase, detect at least one instance of switching based on the first rate of change associated with voltage of the subsystem in the first phase of the multiphase electrical system, determine electrical operating time of the circuit breaker, based on the detected at least one instance of switching and estimate a time for switching based on the determined electrical operating time of the circuit breaker and system characteristics data associated with the subsystem, and a memory module functionally coupled to the one or more processors.

In an embodiment, the one or more processors are further configured to detect a plurality of instances of switching associated with a plurality of phases in the multiphase electrical system based on a third rate of change of voltage of the subsystem in a second phase, upon unavailability of the first rate of change of voltage of the subsystem in the first phase, wherein the second phase is one of a last phase to close and a first phase to open.

Systems and methods of varying scope are described herein. In addition to the aspects and advantages described in this summary, further aspects and advantages will become apparent by reference to the drawings and with reference to the detailed description that follows.

DETAILED DESCRIPTION

In the following detailed description, reference is made to the accompanying drawings that form a part hereof, and in which is shown by way of illustration specific embodiments, which may be practiced. These embodiments are described in sufficient detail to enable those skilled in the art to practice the embodiments, and it is to be understood that other embodiments may be utilized and that logical, mechanical, electrical and other changes may be made without departing from the scope of the embodiments. The following detailed description is, therefore, not to be taken in a limiting sense.

Figure 1:
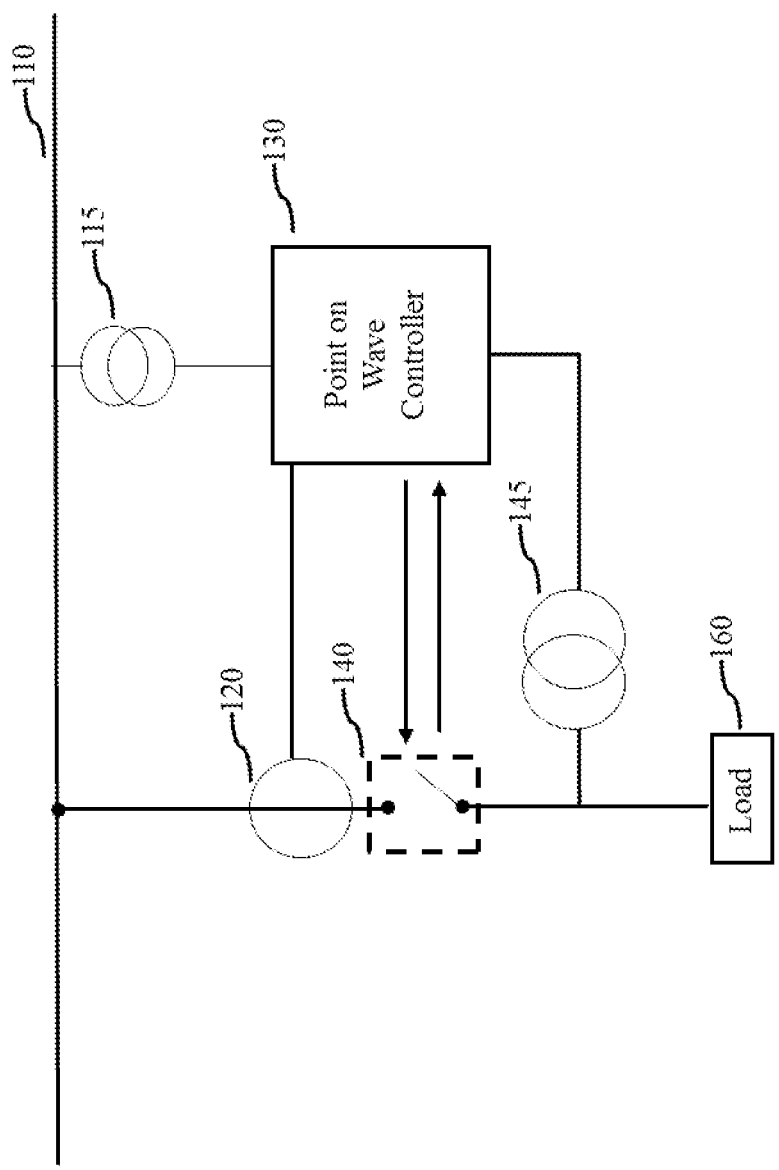
FIG. 1 illustrates a typical single line representation of a multiphase electrical system, in accordance with various embodiments of the present invention.

FIG. 1 illustrates a multiphase electrical system 100. The multiphase electrical system 100 includes a power source (represented in figure as a bus 110). The power source 110 can be connected to an electrical subsystem or load 160 through a circuit breaker 140. The circuit breaker can perform a closing operation to establish electrical connection between the power source 110 and the subsystem 160 in a phase and an opening operation to interrupt the electrical connection between the power source 110 and the subsystem 160 in a phase. The closing operation and opening operation are generally referred to as switching.

At least one phase of the electrical subsystem 160 is capable of being at an electric potential resulting from electrical characteristics of electrical components within the subsystem 160, when disconnected from the power source 110. The potential in the at least one phase disconnected from the power source 110 is due to electrostatic or electrodynamic induction from a neighboring electrical element. For example, the electrical subsystem 160 is a three limb three phase transformer with inter phase coupling between the phases L1, L2 and L3. In the example, when L1 phase of the transformer is connected to the power source 110, due to the inter phase coupling, voltage is induced in the L2 and L3 phases of the transformer.

In another example, the subsystem 160 is a capacitor bank. Despite being disconnected from the power source 110, the capacitor bank is at a voltage due to the charges stored in itself. Similarly, in yet another example, the subsystem 160 is a transmission line which is at a voltage induced by a neighboring transmission line. In yet another example, the subsystem 160 is a multiphase transmission line, wherein one phase has been energized by the power source 110. Due to the energized phase, a voltage would be induced in the phases. In another example, the subsystem 160 is a multiphase transmission line, where one or more phases have been disconnected from the power source 110. However, due to the inductive nature of the transmission line and capacitive circuit formed between ground and the transmission line, an oscillating voltage is present in the transmission line immediately after disconnection.

The circuit breaker 140 is provided for protection and switching purposes. Opening and closing of the circuit breaker 140 is controlled by a point on wave controller 130 (also referred to as an intelligent electronic device 130 or controller 130). The point on wave controller 130 is used to determine appropriate switching instances for operating the corresponding circuit breaker 140 to ensure minimal electrical disturbance in the electrical system 100, and to ensure that electrical and mechanical shock generated while switching are minimal. The point on wave controller 130 is configured to receive information relating to voltage at the subsystem 160 from a voltage measuring means such as a potential transformer 145. Similarly, the point on wave controller 130 is configured to receive information related to the current and voltage of the power source 110 from a current measuring means (such as a current transformer 120) and voltage measuring means (such as a voltage transformer 115) respectively.

The point on wave controller 130 includes one or more processors for computation and estimation of a time for switching, a memory module functionally coupled to the one or more processors for storing information required to determine an electrical operating time of the circuit breaker 140 perform estimation of the time for switching, and a network interface capable of communicating over an communication channel. The network interface of the point on wave controller 130 is configured to receive information (referred to as system characteristics data) about the electrical subsystem 160 to which the corresponding circuit breaker 140 is connected. The one or more processors of the point on wave controller 130 are configured to monitor the voltage of the subsystem 160 in the one or more phases, determine one or more rate of changes from the voltage in the phases, detect one or more instances of switching, and determine electrical operating time of the corresponding circuit breaker 140. These aspects are further explained in reference to FIG. 2.

It is to be noted by a person skilled in the art that the subsystem 160 mentioned herein includes electrical elements and devices such as transmission lines, power transformers, capacitor banks, shunt reactors, motor loads, etc., which are capable of drawing power from the power source 110.

Additionally, it is to be noted that communication of voltage and current measurement from the voltage transformer 115, the voltage transformer 145 and the current transformer 120 to the point on wave controller 130 can be performed in a plurality of ways using networks and corresponding network configurations known to the person skilled in art. Similarly, it is to be noted by a person skilled in the art that while FIG. 1 discloses circuit breaker 140, similar switching devices can also be used in place of the circuit breaker 140.

Figure 2:
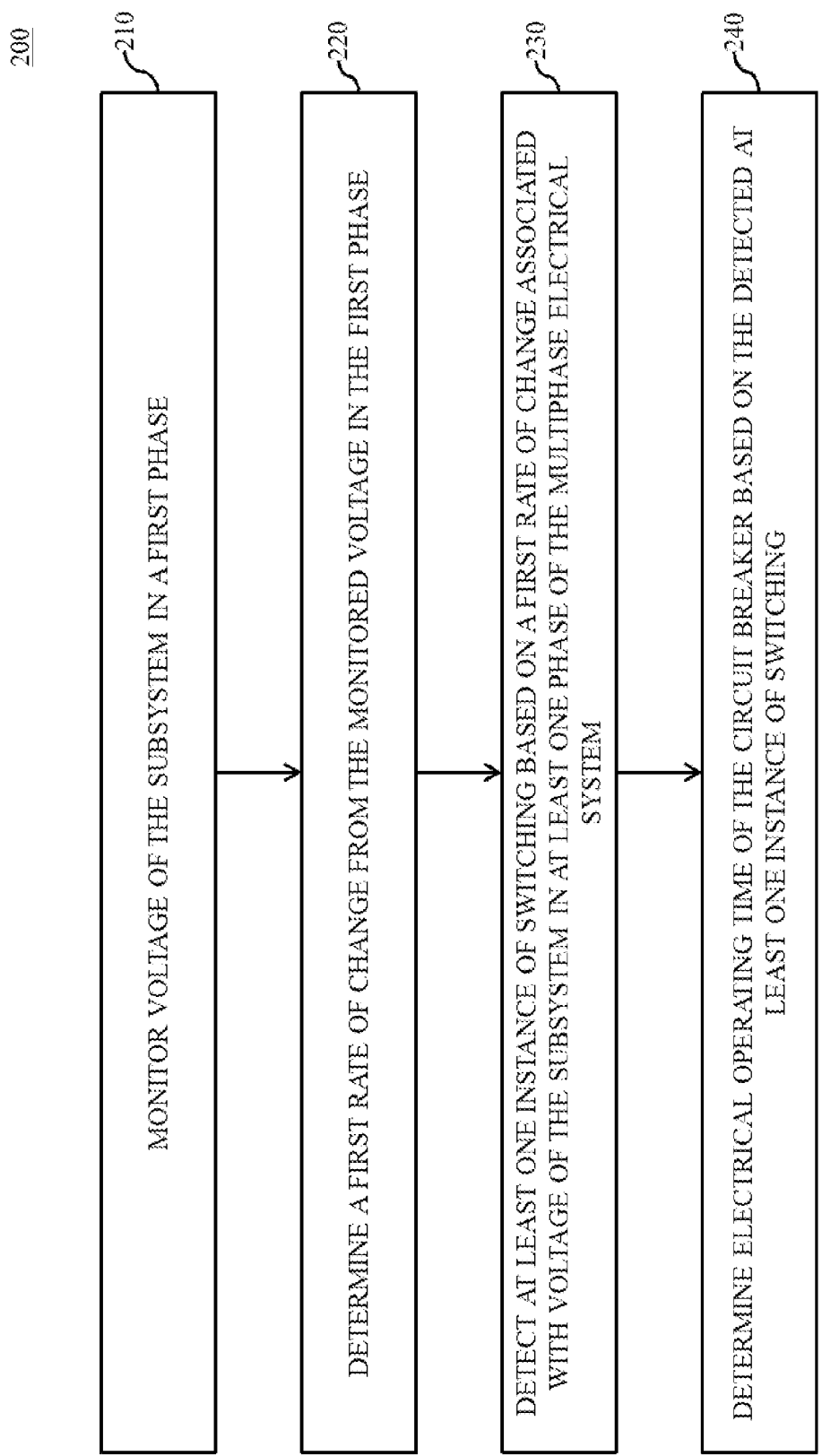
FIG. 2 is a flowchart of a method for determining an electrical operating time of a circuit breaker in the multiphase electrical system using a controller, in accordance with various embodiments of the present invention.

FIG. 2 is a flowchart 200 of a method of performing point on wave switching in the in the multiphase electrical system 100 having the power source 110 connectable to the subsystem 160 through the circuit breaker 140 operated or controlled by the point on wave controller 130. As mentioned previously, a first phase of the subsystem 160 is at the electric potential.

At step 210, the controller 130 monitors the voltage of the subsystem 160 in the first phase through the potential transformer 145. The potential transformer 145 continuously measures the voltage of the subsystem 160 and sends sampled values of the voltage in the first phase to the controller 130. At step 220, based on the sampled values, the controller 130 determines the first rate of change associated with the voltage of subsystem 160 in the first phase. In embodiment, the first rate of change is the second order differential derived from the sample values of the voltage in the first phase of the subsystem 160.

At step 230, the controller 130 detects an instance of switching based on a first rate of change associated with voltage of the subsystem 160 in the first phase of the multiphase electrical system 100. Based on the first rate of change, the controller 130 detects the instance of switching in any one phase of the subsystem 160. In an embodiment, the controller 130 compares the determined first rate of change to a predetermined threshold. Whenever the value of the first rate of change is greater than the predetermined threshold, the controller 130 determines that switching has happened and the instance at which the value of the first rate of change is greater than the predetermined threshold, is detected as the instance of switching. In an embodiment, the predetermined threshold is based on a percentage on the voltage of the power source 110.

In embodiment, the controller 130 monitors voltage of the power source 110 in the first phase of the power source 110 through the potential transformer 115. The potential transformer 115 continuously measures the voltage of the power source 110 and sends sampled values of the voltage in the first phase of the power source 110 to the controller 130. Based on the sampled values, the controller 130 determines a second rate of change associated with the voltage of power source 110 in the first phase. In an embodiment, the second rate of change is a maximum value of second differential in a half cycle period, calculated from the sampled values of the voltage in the first phase of the power source 110. In yet another embodiment, the second rate of change is determined by calculating an average of values derived by taking the second-order differential of the sampled values of the voltage in the first phase of the power source 110, in a half cycle.

Then, the controller 130 determines a ratio based on the first rate of change associated with voltage of the subsystem 160 in the first phase and the second rate of change associated with the voltage of the power source 110 in the first phase. When the value of the ratio is above a predetermined threshold, the controller 130 detects an instance of switching. The steps 210-230 are further illustrated using an exemplary close operation as shown in FIG. 3.

Figure 3:
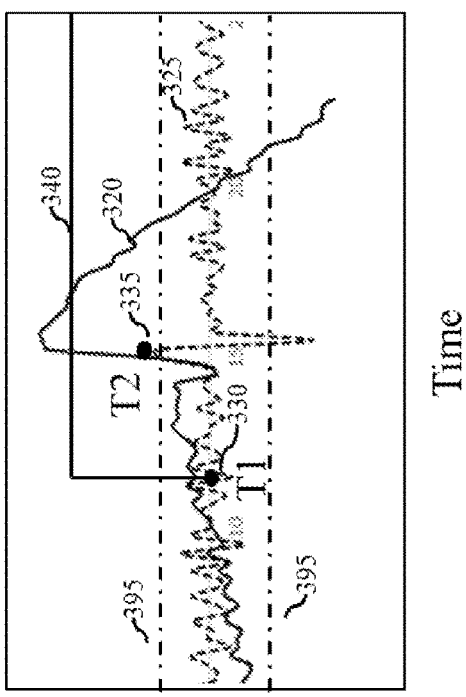
FIG. 3 illustrates waveform of voltage of a power source in a first phase and waveform of voltage of a subsystem in the first phase during a closing operation, in accordance with various embodiments of the present invention.
Figure 3:
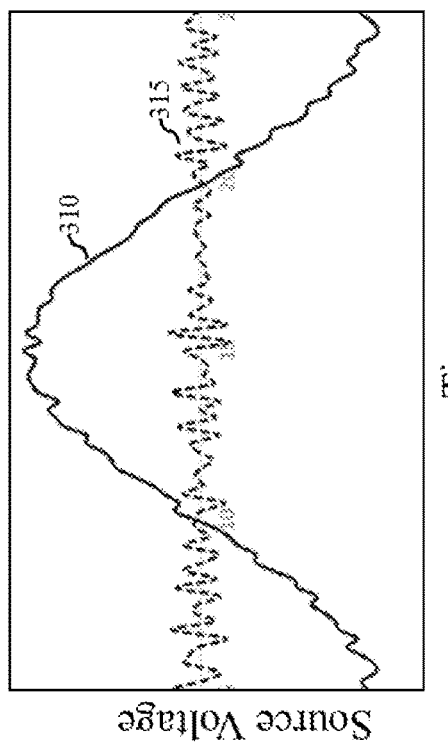

In FIG. 3, voltage waveform associated with the power source 110 is shown in section A of the figure and voltage waveform associated with the subsystem 160 is shown in section B of the figure during a close operation. The voltage of the power source 110 in the first phase is shown as solid waveform 310 and the second rate of change (second order differential in the current example) of the voltage of the power source is shown as dotted waveform 315. Similarly, voltage of the subsystem 160 in the first phase is shown as solid waveform 320 and the first rate of change (second order differential in the current example) of the voltage of the power source is shown as dotted waveform 325.

At T1 (shown in the figure as dot 330), a command (indicated in the figure as line 340) for closing or connecting the subsystem 160 to power source 110 in the first phase was given to the circuit breaker 140. At T2 (shown in the figure as dot 335), an electrical connection is established between the power source 110 and the subsystem 160 in the first phase via the circuit breaker 140.

As seen from the FIG. 3, prior to T1, in spite of being disconnected from the power source a voltage is seen in the first phase of the subsystem 160. As explained previously, this voltage is induced in the subsystem 160 by a neighboring electrical element or due to existence of residual charges or fluxes.

Prior to T2, despite the existence of voltage (which appears to be sinusoidal in the example) in the first phase of the subsystem 160, the first rate of change i.e. second order differential of the voltage of the subsystem 160 in the first phase is relatively around a value or within a band as such. However at the instance when the close operation takes place (i.e. T2) there is a sharp change (in the example sharp increase and immediate decrease) in the second order differential of the voltage of the subsystem 160 in the first phase. Subsequent to the sharp oscillation resulting due to change in voltage in the subsystem 160 in the first phase because of the connection of the subsystem 160 to the power source 110 in the first phase, the first rate of change stabilizes and is relatively around a value or within a band as such. Accordingly, the controller 130 detects an instance of switching when the magnitude of the first rate of change (i.e. waveform 325) associated with the voltage of the subsystem 160 is above a predetermined threshold (indicated as a band using dot-dash lines 395).

At step 240, the controller 130 determines an electrical operating time of the circuit breaker 140, based on the detected at least one instance of switching. The controller 130 determines the electrical operating time of the circuit breaker 140 as the time period between the instance at which the command for switching was provided to the circuit breaker 140 and the instance at which the electrical connection was established between the power source 110 and the subsystem 160 in the first phase. Continuing the exemplary close operation mentioned previously, the controller 130 determines electrical operating time as the time period between T1 and T2. It is to be noted that the electrical operating time as mentioned herein is determined for a corresponding phase in which the switching happened. For a plurality of phases, a plurality of electrical operating time is calculated using the method 200.

In an embodiment, when a command for switching is provided to controller 130, the controller 130 estimates a time for switching based on the determined electrical operating time of the circuit breaker 140 and system characteristics data associated with the subsystem 160.

System characteristics data herein refers to information about all parameters relating to the subsystem 160 that are utilized in estimation of time for switching and in switching strategy. System characteristics data includes, but is not limited to, type of subsystem, grounding configuration of the subsystem, lead operating phase associated with the subsystem, polarity sensitivity preference associated with the subsystem, a correction factor associated with subsystem, residual flux or trapped charges associated with the subsystem.

In an embodiment, the system characteristics data includes a correction factor associated with the subsystem 160. When the point on wave controller 130 notices an error in time for switching, the point on wave controller 130 utilizes the correction factor to correct the time for switching in the next estimation. The error correction process is iteratively performed.

In an embodiment, the controller 130 operates the circuit breaker 140 at the estimated time for switching, for switching the subsystem 160. At the time for switching, the controller 130 issues the command for switching to the circuit breaker 140. Due to the operating time of the circuit breaker 140, the electrical connection between the power source 110 and the subsystem 160 is incepted or interrupted at appropriate time instance determined based on the electrical operating time of the circuit breaker 140 and the system characteristics of the subsystem 160.

It is to be noted by a person skilled in the art that while the term first phase has been used to identify a particular phase in the system 100, it is not to be understood as the first phase to open or the first phase to close. For clarity, it is mentioned that first phase as mentioned herein can refer to any phase regardless of the position of that phase in the sequence of switching. It is to be noted by a person skilled in the art that while the above method is explained for detecting an instance of switching in the first phase by monitoring the first rate of change of voltage of the subsystem 160 in the first phase, the method can be extended to detecting a plurality of instances of switching associated with corresponding phases by monitoring a plurality of rate of changes of the voltages of the corresponding phases of subsystem 160. This is explained below.

In an embodiment, the controller 130 monitors the voltage of the subsystem 160 in the first phase and a second phase. A potential transformer (not shown in figure) measures the voltage of the subsystem 160 in the second phase and sends sampled values of the voltage in the second phase of the subsystem 160 to the controller 130. Based on the sampled values, the controller 130 determines a third rate of change associated with the voltage of subsystem 160 in the second phase. In an embodiment, the third rate of change is the second order differential derived from the sample values of the voltage in the second phase of the subsystem 160. Based on the first rate of change and the third rate of change, the controller 130 can detect an instance of switching in the first phase and an instance of switching in the second phase. This is explained using FIG. 5.

Figure 5:
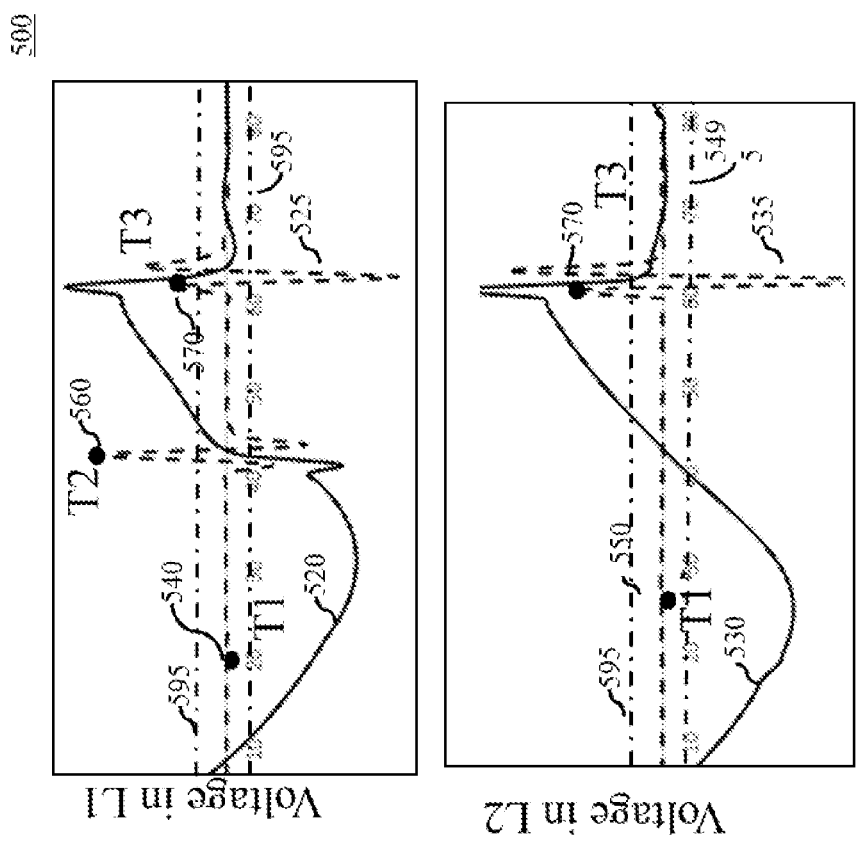
FIG. 5 illustrates a waveform of voltage of a power source in a first phase of a multi-phase system and the waveforms of voltage of a subsystem in the first phase and second phase of a multiphase subsystem during an opening operation, in accordance with various embodiments of the present invention.
Figure 5:
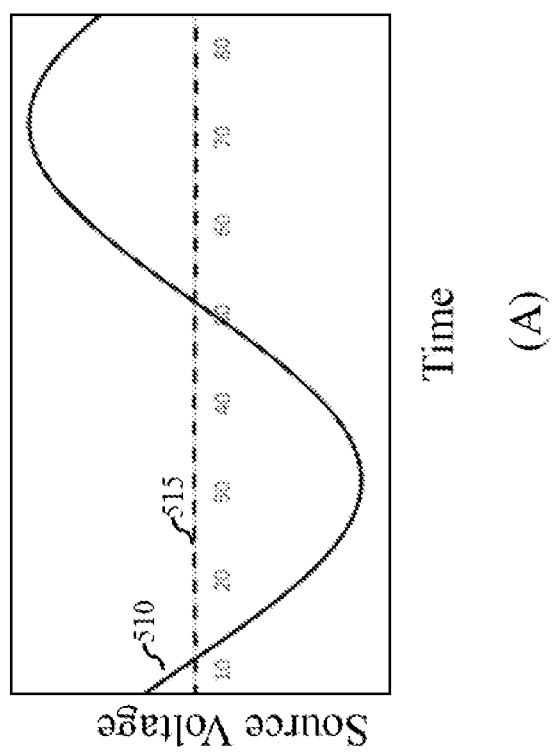

In FIG. 5, voltage waveform associated with the power source 110 is shown in section A of the figure and voltage waveform associated with the subsystem 160 is shown in section B of the figure during an open operation. The subsystem 160 in the current example is a transformer 160. The voltage of the power source 110 in the first phase is shown as solid waveform 510 and the second rate of change (second order differential in the current example) of the voltage of the power source is shown as dotted waveform 515.

Similarly, voltage of the subsystem 160 in the first phase is shown as solid waveform 520 and the first rate of change (second order differential in the current example) of the voltage of the subsystem 160 in the first phase is shown as dotted waveform 525. Similarly, voltage of the subsystem 160 in the second phase is shown as solid waveform 530 and the third rate of change (second order differential in the current example) of the voltage of the subsystem 160 in the second phase is shown as dotted waveform 535.

At T1 (shown in the FIG. 5 as dot 540), a command for opening or disconnecting the subsystem 160 from power source 110 in the first phase was given to the circuit breaker 140. At T1' (shown in the FIG. 5 as dot 550), a command for opening or disconnecting the subsystem 160 from power source 110 in the second phase was given to the circuit breaker 140. At T2 (shown in the FIG. 5 as dot 560), the electrical connection between the power source 110 and the subsystem 160 is interrupted in the first phase by the circuit breaker 140. Similarly at T3 (shown in the figure as dot 570), the electrical connection between the power source 110 and the subsystem 160 is interrupted in the second phase by the circuit breaker 140.

As seen from the FIG. 5, subsequent to T2, in spite of being disconnected from the power source 110, a voltage is still seen in the first phase of the subsystem 160. As explained previously, this voltage is induced in the subsystem 160 by a neighboring electrical element including the inductive effect of the second phase of the subsystem 160 which is still connected to the power source 110.

Prior to T2, despite the existence of voltage (which is the source voltage due to the power source 110) in the first phase of the subsystem 160, the first rate of change i.e. second order differential of the voltage of the subsystem 160 in the first phase is relatively around a value or within a band as such. However at the instance when the electrical connection is interrupted in first phase (i.e. at T2) there is a sharp change in the second order differential of the voltage of the subsystem 160 in the first phase.

Subsequent to the sharp oscillation resulting due to the change in voltage in the subsystem 160 in the first phase because of the disconnection of the subsystem 160 to the power source 110 in the first phase, the first rate of change stabilizes and is relatively around a value or within a band as such. Accordingly, the controller 130 detects an instance of switching when the magnitude of the first rate of change (i.e. waveform 525) associated with the voltage of the subsystem 160 in the first phase is above a predetermined threshold (indicated as a band using dot-dash lines 595).

Similarly, prior to T3, despite the existence of voltage (which is the source voltage due to the power source 110) in the second phase of the subsystem 160, the third rate of change i.e. second order differential of the voltage of the subsystem 160 in the second phase is relatively around a value or within a band as such. However at the instance when the electrical connection is interrupted in the third phase (i.e. T3) there is a sharp change in the second order differential of the voltage of the subsystem 160 in the first phase and in the second phase. Subsequent to the sharp oscillation resulting due to change in voltage in the subsystem 160 in the first phase and the second phase because of the disconnection of the subsystem 160 to the power source 110 in the second phase, the first rate of change and the third rate of change stabilizes and are relatively around a value or within a band as such. Accordingly, the controller 130 detects an instance of switching when either the magnitude of the first rate of change (i.e. waveform 525) or the magnitude of the third rate of change (i.e. waveform 535) associated with the voltage of the subsystem 160 in the first phase or the second phase respectively are above a predetermined threshold (indicated as a band using dot-dash lines 595).

As mentioned previously and illustrated in FIG. 5, the controller 130 detects two instances of switching by monitoring the first rate of change of the voltage in the first phase of the subsystem 160 (one instance of switching in the first phase and one instance of switching in the second phase) and an instance of switching by monitoring the third rate of change of voltage in the second phase of the subsystem 160. Therefore, the controller 130 detects three instances of switching by monitoring the first rate of change and the third rate of change. Out of the three instances of switching detected by the controller 130, a duplicate instance of switching is present. In an embodiment, the controller 130 is capable of eliminating redundant or duplicate instances of switching and associating an instance of switching with the corresponding phase.

In yet another embodiment, the controller 130 is configured to utilize the duplicate instance of switching to ensure reliable detection of switching. The controller 130 determines the ratio of the first rate of change and second rate of change and a second ratio of the third rate of change and the second rate of change. The controller 130 selects one ratio from the ratio and the second ratio based on the magnitude of the ratios. Accordingly, as explained previously, the controller 130 utilizes the selected one ratio to detect the one or more instances of switching in the first and second phase.

In an embodiment, the switching operation performed was an open operation, the controller 130 associates the detected plurality of instances of switching with respective phases and removes duplicate instances of switching, by associating an instance of switching from the plurality of instances of switching with a corresponding phase from the multitude of phases. An instance of switching associated with a corresponding phase is the first instance of switching detected in the corresponding phase within a predetermined time window. The predetermined window is a time window or time period calculated by adding a mechanical operating time associated with circuit breaker 140 along with predetermined tolerance to the time instance at which the command to interrupt the electrical connection between the subsystem 160 and the power source 110 in the corresponding phase was given.

Continuing the above mentioned example illustrated in FIG. 5, the predetermined window for the first phase is a time period calculated by adding the mechanical operating time of the circuit breaker 140 along with the tolerance to the time instance T1. The controller 130 associates the first instance of switching (which is detected at T2) within the predetermined window for the first phase, with the first phase. Similarly, the predetermined window for the second phase is a time period calculated by adding the mechanical operating time of the circuit breaker 140 along with the tolerance to the time instance T1. The controller 130 associates the first instance of switching (which is detected at T3) within the predetermined window for the second phase, with the second phase.

Similarly, in an embodiment, the switching operation performed was a close operation, the controller 130 associates the detected plurality of instances of switching with respective phases and removes duplicate instances of switching by associating an instance of switching from the plurality of instances of switching with a corresponding phase from the multitude of phases. An one instance of switching associated with a corresponding phase is the last instance of switching in the corresponding phase within a predetermined time window. The predetermined window is a time window or time period calculated by adding a mechanical operating time associated with circuit breaker 140 along with predetermined tolerance to the time instance at which the command to establish the electrical connection between the subsystem 160 and the power source 110 in the corresponding phase was given.

Based on the associations made as explained previously, in an embodiment, the controller determines a sequence of switching associated with the one or more phases of the multiphase electrical system 100. Continuing the above mentioned example illustrated in FIG. 5, the controller 130 can determine the sequence of switching as the first phase and then the second phase, as the associated instance of switching of the first phase (T2) precedes the associated instance of switching of the second phase (T3).

In yet another embodiment, the controller 130 can determine the sequence of switching associated with the one or more phases of the subsystem 160 by counting the number of instances of switching detected in each phase. When the switching operation is an opening operation, a particular phase precedes all other phases in the sequence of switching when the number of instances of switching detected on that particular phase is greater than the number of instances of switching detected in any phase from the other phases.

Similarly, when the switching operation is a closing operation, a particular phase succeeds all other phase in the sequence of switching when the number of instances of switching detected on that particular phase is greater than the number of instances of switching detected in any phase from the other phases.

Additionally, it is to be noted by a person skilled in the art, that switching herein refers to closing or opening of the subsystem 160 using a circuit breaker 140. Similarly, it is to be noted by a person skilled in the art that while the same phase (i.e. the first phase) which was used for monitoring the subsystem 160, has been used for monitoring the voltage in the power source 110, any other phase of the power source 110 can also be monitored and utilized according to known techniques.

In an embodiment, the controller 130 can detect a plurality of instances of switching in corresponding phases by monitoring the first rate of change of voltage of the subsystem 160 in the first phase when one or more phases of the subsystem 160 are coupled with each other. This is further explained using an exemplary closing operation illustrated in FIG. 4.

Figure 4:
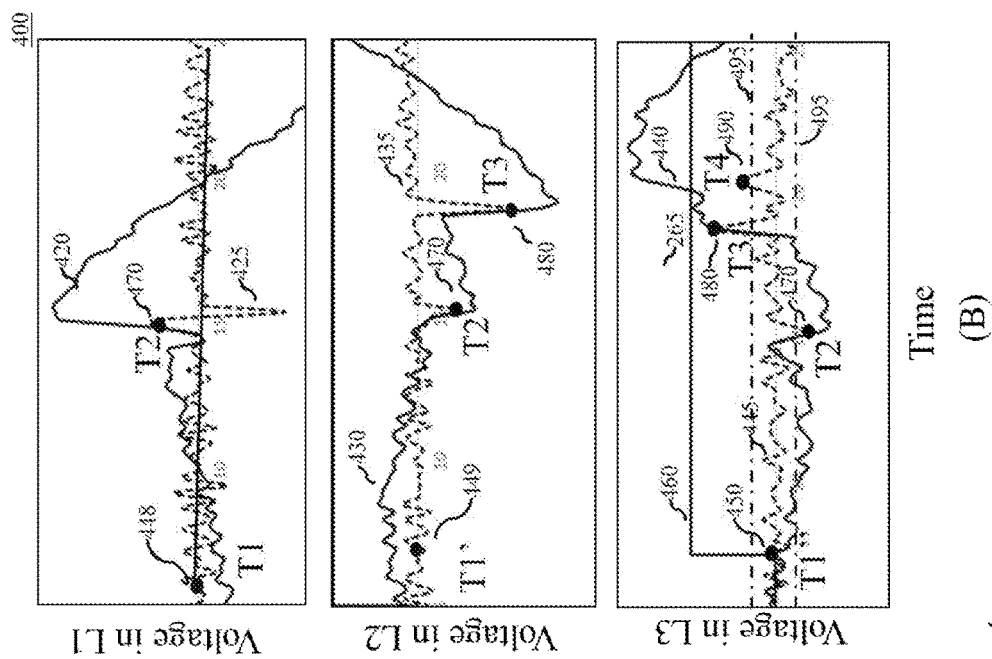
FIG. 4 illustrates waveform of voltage of a power source in a first phase of a three phase system and waveforms of voltage of a subsystem in three phases of a three phase system during a closing operation, in accordance with various embodiments of the present invention.
Figure 4:
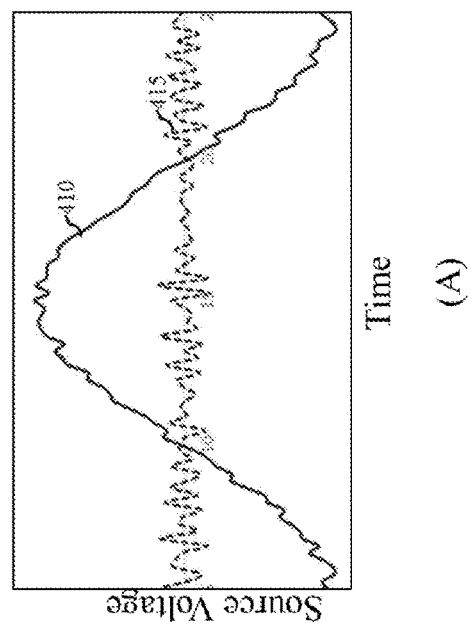

In the current example illustrated by the FIG. 4, the subsystem 160 is a transformer with inter-phase coupling (i.e. energization of one phase induces voltage in the remaining phases). In the current example, the L3 phase of the subsystem 160 is monitored by the controller 130, and the voltages of L1 and L2 phases of the transformer 160 are not monitored directly.

In FIG. 4, voltage waveform associated with the power source 110 is shown in section A of the figure and voltage waveforms associated with the subsystem 160 is shown in section B of the figure during a close operation. The voltage of the power source 110 in the first phase is shown as solid waveform 410 and the second rate of change (second order differential in the current example) of the voltage of the power source is shown as dotted waveform 415.

Similarly, voltage of the subsystem 160 in L1 phase is shown as solid waveform 420 and a rate of change (second order differential in the current example) of the voltage of the subsystem 160 in L1 is shown as dotted waveform 425. The voltage of the subsystem 160 in the L2 phase is shown as solid waveform 430 and a rate of change (second order differential in the current example) of the voltage of the subsystem 160 in L2 is shown as dotted waveform 435. The voltage of the subsystem 160 in the L3 phase is shown as solid waveform 440 and the first rate of change (second order differential in the current example) of the voltage of the subsystem 160 in L3 is shown as dotted waveform 445.

At T1 (shown in the figure as dot 448), a command for closing or connecting the transformer 160 to power source 110 in phase L1 was given to the circuit breaker 140. Similarly, at T1' (shown in the figure as dot 449), a command for closing or connecting the transformer 160 to power source 110 in phase L2 was given to the circuit breaker 140. At T1" (shown in the figure as dot 450), a command (indicated in the figure as line 460) for closing or connecting the transformer 160 to power source 110 in phase L3 was given to the circuit breaker 140. At T2 (shown in the figure as dot 470), an electrical connection is established between the power source 110 and the subsystem 160 in the L1 phase via the circuit breaker 140. At T3 (shown in the figure as dot 480), an electrical connection is established between the power source 110 and the subsystem 160 in the L2 phase via the circuit breaker 140. At T4 (shown in the figure as dot 490), an electrical connection is established between the power source 110 and the subsystem 160 in the L3 phase via the circuit breaker 140.

As seen from the FIG. 4, prior to T1, in spite of being disconnected from the power source, voltages are seen in the all three phases of the subsystem 160. As explained previously, this voltage is induced in the subsystem 160 by a neighboring electrical element.

Prior to T2, despite the existence of voltage (which appears to be sinusoidal in the example) in the first phase (the phase being monitored by the controller 130 i.e. L3 phase) of the subsystem 160, the first rate of change i.e. second order differential of the voltage of the subsystem 160 in the first phase (i.e. the L3 phase) is relatively around a value or within a band as such.

However at the instances (T2, T3 and T4) when switching happens in any of the three phases there is a sharp change in the second order differential of the voltage of the subsystem 160 in the L3 phase. Due to interphase coupling, whenever a switching operation takes places in L1 or L2, the voltage in L3 is also affected. Subsequent to the sharp oscillation resulting due to change in voltage in the subsystem 160 in the L3 phase because of the switching in any of the phases, the first rate of change stabilizes and is relatively around a value or within a band as such.

Accordingly, the controller 130 detects instances of switching in all the three phases based on the first rate of change of voltage in the L3 phase. In an embodiment, the controller 130 detects an instance of switching when the magnitude of the first rate of change associated with the voltage of the subsystem 160 in the first phase (i.e. L3 phase) is above a predetermined threshold (indicated as a band using dot-dash lines 495). In another embodiment, as previously explained, the controller 130 derives the second rate of change associated with the power source 110 in L3 phase and calculates a ratio of the first rate of change and the second rate of change. The controller 130 detects an instance of switching when the ratio is greater than a predetermined threshold.

In an embodiment, the system characteristics data associated with the subsystem 160 includes a predetermined sequence of switching associated with the one or more phases of the subsystem 160. Based on the predetermined sequence of switching, the controller 130 associates the plurality of instances of switching detected by monitoring a single phase (in example explained previously, the single phase being the L3 phase), with the corresponding phases to determine electrical operating time of the circuit breaker 140 in each phase. Continuing the example illustrated in FIG. 4, the controller 130 detects three instances of switching i.e. T2, T3 and T4. The predetermined sequence of switching (as seen from the figure as well) is L1, L2 and L3. Accordingly, the controller 130 can associate T2 as the instance at which L1 was closed, T3 as the instance at which L2 was closed and T4 as the instance at which L3 was closed. Then, the controller 130 can calculate the electrical operating time for each phase by comparing the instance at which the switching happened for that phase (T2, T3, and T4) against the instance at which the command to close was given (T1, T1', and T1").

In an embodiment, the power source 110 is noisy and the voltage of the power source 110 includes certain undesired harmonics in it. For capacitive loads, when performing switching near voltage zero crossing point across the circuit breaker 140, it is difficult to differentiate between the influence of noise in voltage of the subsystem 160 arising due to the noisy power source 110 and switching operation, in the rate of change of voltage of the subsystem 160. Therefore, the controller 130 cannot rely on absolute value of the magnitude of the first rate of change associated with the voltage of the subsystem 160 in the first phase. To counter the effects of noise arising due to the noisy power source 110, the ratio calculated from the first rate of change and the second rate of change, as previously described, is utilized by the controller 130 in detecting the instance of switching. By utilizing the ratio of the first rate of change and the second rate of change, noise generated by the switching operation in a phase and reflected in the other phases of the power source 110 and the subsystem 160 can also be effectively negated while detecting an instance of switching.

In an embodiment, the controller 130 is configured to switch from detecting a plurality of instances of switching by monitoring a plurality of rate of change associated with a plurality of phases, to detecting a plurality of instances of switching associated with a plurality of phases by monitoring a first rate of change of voltage of subsystem 160 in a first phase, as explained previously in paragraph 59. This is particularly of use, when one or more rate of change associated with one or more phases is no longer available and the first rate of change associated with voltage of the subsystem 160 in the first phase is still available.

When a plurality of instances of switching are detected by monitoring a rate of change of voltage in a single phase, in an embodiment, the controller 130 is configured to change the sequence of switching to ensure that phase on which the voltage is being monitored, is the last to close and the first to open. In an embodiment, when one or more rate of changes associated with one or more phases are unavailable, the controller 130 is configured to change the sequence of switching to ensure that the unavailable phases (i.e. phases where the rate of change of voltage information is unavailable or unreliable) are among the last phases to open and among the first phases to close.

This written description uses examples to describe the subject matter herein, including the best mode, and also to enable any person skilled in the art to make and use the subject matter. The patentable scope of the subject matter is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A method (200) of determining an electrical operating time of a circuit breaker (140) for performing point on wave switching in a multiphase electrical system (100) having a subsystem (160) connectable to a power source (110), through the circuit breaker (140) operated by a controller (130), wherein the subsystem (160) is at an electric potential resulting from electrical characteristics of electrical components within the subsystem (160) and wherein the controller (130) is connected to a potential transformer (145) for measuring voltage of the subsystem (160) in a first phase, the method (200) comprising:
   a. monitoring (210) the voltage of the subsystem (160) in the first phase,
   b. determining (220) a first rate of change from the monitored voltage in the first phase;
   c. detecting (230) at least one instance of switching based on the first rate of change (325) associated with voltage of the subsystem (160) in the first phase of the multiphase electrical system; and
   d. determining (240) an electrical operating time of the circuit breaker (140) based on the detected at least one instance of switching and an instance at which a command for switching was provided to the circuit breaker (140).

2. The method as claimed in claim 1, further comprising estimating a time for switching the circuit breaker (140), based on the determined electrical operating time of the circuit breaker (140) and system characteristics data associated with the subsystem (160).

3. The method as claimed in claim 1, wherein detecting the at least one instance of switching further comprises:
   i. monitoring a voltage associated with the power source (110) in at least one phase;
   ii. calculating at least one second rate of change from voltage associated with the power source (110) in the at least one phase within a half cycle; and
   iii. determining a ratio based on the first rate of change and the at least one second rate of change for detecting the at least one instance of switching.

4. The method as claimed in claim 1, wherein the method further comprises associating the detected at least one instance of switching with a corresponding phase of the multiphase electrical system (100), wherein the at least one instance of switching, is a last instance of switching in the corresponding phase within a predetermined time window, wherein the predetermined window is based on a mechanical operating time associated with circuit breaker (140).

5. The method as claimed in claim 1, wherein the method further comprises associating the detected at least one instance of switching with a corresponding phase of the multiphase electrical system (100), wherein the at least one instance of switching, is a first instance of switching in the corresponding phase within a predetermined time window, wherein the predetermined window is based on a mechanical operating time associated with circuit breaker (140).

6. The method as claimed in claim 4, wherein the method further comprises determining a sequence of switching associated with the one or more phases of the multiphase electrical system (100) based on association between one or more instances of switching and the corresponding one or more phases.

7. The method as claimed in claim 5, wherein the method further comprises determining a sequence of switching associated with the one or more phases of the multiphase electrical system (100) based on association between one or more instances of switching and the corresponding one or more phases.

8. A controller (130) configured to operate a circuit breaker (140) in a multiphase electrical system (100) having a power source (110) connectable to a subsystem (160), wherein the subsystem (160) is at an electric potential resulting from electrical characteristics of electrical components within the subsystem (160) and wherein the controller (130) is connected to a potential transformer (145) for measuring voltage of the subsystem (160) in a first phase, the controller (130) comprising:
   a. one or more processors configured to
      i. monitor the voltage of the subsystem (160) in the first phase, and
      ii. determine a first rate of change from the monitored voltage in the first phase
      iii. detect at least one instance of switching based on the first rate of change associated with voltage of the subsystem (160) in the first phase of the multiphase electrical system
      iv. determine electrical operating time of the circuit breaker (140), based on the detected at least one instance of switching and;
      v. estimate a time for switching based on the determined electrical operating time of the circuit breaker (140) and system characteristics data associated with the subsystem (160); and
   b. a memory module functionally coupled to the one or more processors.

9. The controller (130) as claimed in claim 8, wherein the one or more processors are further configured to detect a plurality of instances of switching associated with a plurality of phases in the multiphase electrical system (100) based on a third rate of change of voltage of the subsystem (160) in a second phase, upon unavailability of the first rate of change of voltage of the subsystem (160) in the first phase, wherein the second phase is one of a last phase to close and a first phase to open.

* * * * *